United States Patent [19]
Suyama et al.

[11] Patent Number: 5,274,585
[45] Date of Patent: Dec. 28, 1993

[54] SEMICONDUCTOR MEMORY DEVICE

[75] Inventors: Junichi Suyama; Yasuhiro Tokunaga, both of Tokyo, Japan

[73] Assignee: Oki Electric Industry Co., Ltd., Tokyo, Japan

[21] Appl. No.: 755,140

[22] Filed: Sep. 5, 1991

[30] Foreign Application Priority Data

Sep. 17, 1990 [JP] Japan .................. 2-246689

[51] Int. Cl.⁵ .............................................. G11C 5/06
[52] U.S. Cl. .................................. 365/149; 365/63; 365/205
[58] Field of Search ............. 365/149, 52, 63, 230.03, 365/205, 203, 204, 51

[56] References Cited
U.S. PATENT DOCUMENTS 4,799,197  1/1989  Kodama et al. ............... 365/149 X

FOREIGN PATENT DOCUMENTS 63-197092  8/1988  Japan .
2-150061   6/1990  Japan .

*Primary Examiner*—Joseph A. Popek
*Attorney, Agent, or Firm*—Spencer, Frank & Schneider

[57] ABSTRACT

A semiconductor memory device includes a plurality of bit lines, a plurality of memory cells connected to the bit line. The semiconductor memory device also includes control circuits, a first control line and a second control line. The control circuit outputs a control signal. The first control line is formed by a first low resistance conductive layer and is connected to the control circuit to transfer the control signal. The first control signal extends to a first direction. A second control line is formed by a second low resistance conductive layer which is separated from the first conductive layer by an insulating layer. The second control line is connected to the control circuit to transfer the control signal and extends to a second direction which is substantially different from the first direction.

14 Claims, 3 Drawing Sheets ns 5,274,585

SEMICONDUCTOR MEMORY DEVICE

CROSS REFERENCE TO RELATED APPLICATION

This application claims the priority of Japanese Patent Application Serial No. 2-246,689, filed Sep. 17, 1990, the subject matter which is incorporated herein by reference.

BACKGROUND OF THE INVENTION

This invention relates to a semiconductor memory device, and more particularly, to a semiconductor memory device having a plurality of low resistance conductive layers to achieve a high speed operation.

A conventional semiconductor memory device has a plurality of memory cell arrays. Each memory cell array needs a decoder circuit, an equalizing control circuit and a transfer gate control circuit. Output signals of such circuits are transferred to gates of transistors of the memory cell arrays. If the output signals have a timing skew, the semiconductor memory device does not operate with high speed. Therefore, the conventional semiconductor memory device has a plurality of equalizing control circuits and transfer gate control circuits.

SUMMARY OF THE INVENTION

It is an object of the present of the invention to provide a semiconductor memory device having a high integration. It is another object of the present invention to provide a semiconductor memory device having a low resistance wiring connected between gates of transistors in a memory cell and outputs of control circuits. It is yet another object of the present invention to provide a semiconductor memory device having a few number of control circuits.

A semiconductor memory device according to the invention includes a plurality of bit lines, a plurality of memory cells connected to the bit lines. The semiconductor memory device also includes control circuits, a first control line and a second control line. The control circuit outputs a control signal. The first control line is formed by a first low resistance conductive layer and is connected to the control circuit to transfer the control signal. The first control signal extends in a first direction. A second control line is formed by a second low resistance conductive layer which is separated from the first conductive layer by an insulating layer. The second control line is connected to the control circuit to transfer the control signal and extends in a second direction.

BRIEF DESCRIPTION OF THE DRAWINGS

These and other features and advantages of the invention will be further understood from the following detailed description of the preferred embodiments with reference to the accompanying drawings in which.

DETAILED DESCRIPTION OF THE PREFERRED EMBODIMENT

Figure 1:
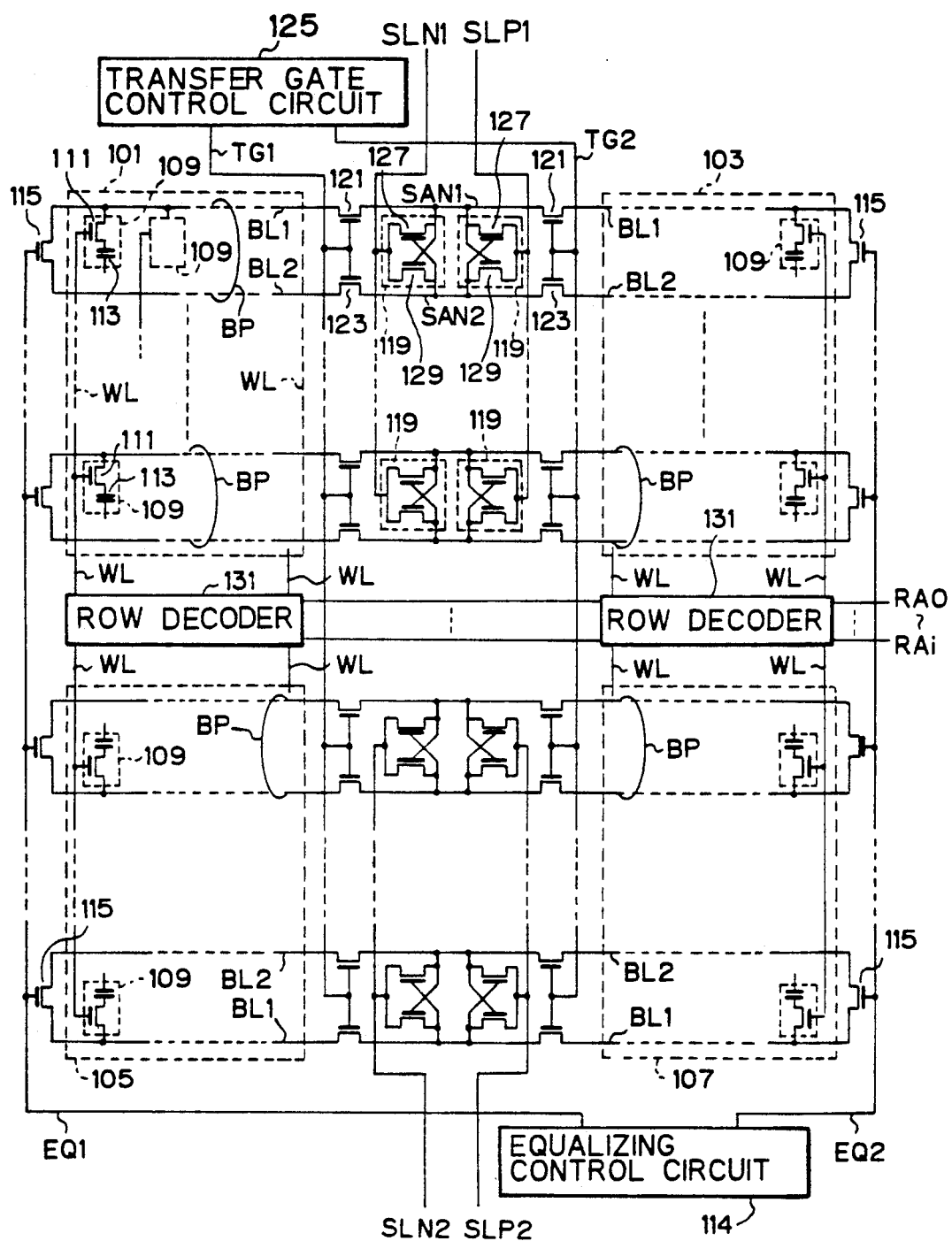
FIG. 1 is a circuit diagram of a semiconductor memory device according to an embodiment of the invention.

An embodiment of the invention will be described with reference to the drawings. FIG. 1 illustrates a circuit of an embodiment of the present invention. A semiconductor memory device of the embodiment has a first, a second, a third and a fourth memory cell arrays 101, 103, 105 and 107, respectively. Each memory cell array has a plurality of memory cells 109, each of which has an N channel MOS transistor 111 and a capacitor 113. Memory cells 109 are arranged in rows and columns. Source electrodes of the MOS transistors 111 in memory cells 109 arranged in a column are connected to a bit line BL1. Gate electrodes of the MOS transistors 111 in a memory cells arranged in a row are connected to a word line WL. Each drain electrode of the MOS transistor 111 is connected to the capacitor 113.

Each bit line BL1 constitutes a pair of bit lines BP with another bit line BL2. One end of the pair of bit lines BP is connected to an equalizing transistor 115 which is an N channel MOS transistor. Gate electrodes of the equalizing transistor 115 are connected to a line EQ1 or EQ2 which is connected to an equalizing control circuit 117. The other end of the pair of bit lines is connected to a sense amplifier 119 through a pair of transfer gate transistors 121, 123 which are N channel MOS transistors. Gate electrodes of the pair of transfer gate transistors 121, 123 are commonly connected to a line TG1 or TG2 which is connected to a transfer gate control circuit 125.

The sense amplifier 119 has a pair of transistors 127 and 129. A source electrode of the transistor 127 and a gate electrode of the transistor 129 are commonly connected to a first sense amplifier node SAN1 (the other end of the bit line BL1). A source electrode of the transistor 129 and a gate electrode of the transistor 127 are commonly connected to a second sense amplifier node SAN2 (the other end of the bit line BL2). Drain electrodes of the transistor 127 and 129 are commonly connected to a sense amplifier control line. Each sense amplifier 119 connected to the same memory cell array are connected to the same sense amplifier control line SLN1, SLN2, SLP1 or SLP2. The transistors 127, 129 of the sense amplifier 119 connected to the first and third memory cell arrays 101, 105 are N type MOS transistors. On the other hand, the transistors 127, 129 of the sense amplifier 119 connected to the second and fourth memory cell arrays 103, 107 are P type MOS transistors.

The word lines WL are connected to a row decoder 131. The row decoder 131 has inputs connected to a plurality of lines RA0 to RAi. The lines RA0 to RAi are connected to a row address buffer, not shown and transfer the row address buffer output signals.

Figure 2:
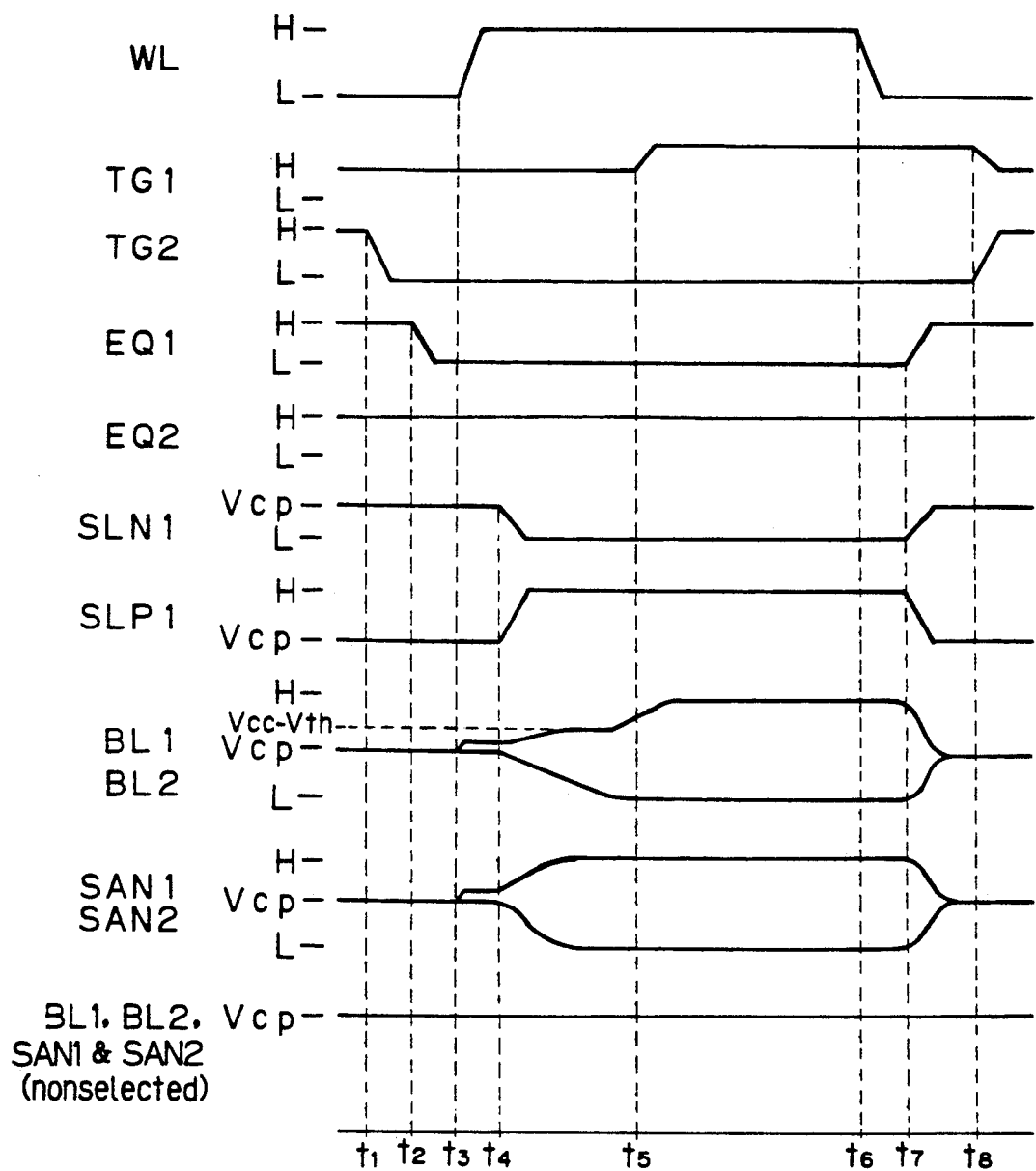
FIG. 2 is a timing chart showing how the circuit in FIG. 1 is operated.

The operation of the circuit illustrated in FIG. 1 will be described with reference to a timing chart shown in FIG. 2. In the following description, the first memory cell array 101 is selected and the second, third and fourth memory cell arrays 103, 105 and 107 are nonselected.

At first, the first and second memory cell arrays 101 and 103 will be described. After the equalizing control circuit 114 and the transfer gate control circuit 125 are activated, a transfer gate control signal TG2 becomes "L" level at a timing t1. Therefore, the transfer gate transistors 121 and 123 connected to the second memory cell array 103 are then in an off state and the second memory cell array 103 is cut off from the first and second sense amplifier nodes SAN1 and SAN2.

At a timing t2, an equalizing control signal EQ1 becomes "L" level and the equalizing transistors 115 connected to the first memory cell array 101 become in the off state. Then, an equalizing of the pair of bit lines BP in the first memory cell array 101 is complete.

At a timing t3, a signal on a selected word line WL in the first memory cell array 101 becomes "H" level and memory cell arrays 109 connected to the selected word line are activated. Then, a minute potential difference appears between the bit lines BL1 and BL2 in the first memory cell array 101. Since a transfer gate control signal TG1 is "H" level at the timing t3, the transfer gate transistors 121 and 123 in the first memory cell array are in an on state. Therefore, the minute potential difference is transferred to the sense amplifier nodes SAN1 and SAN2.

At a timing t4, a sense amplifier control signal SLN1 becomes "L" level, and a sense amplifier control signal SLP1 becomes "H" level. Then, the sense amplifiers 119 connected to the first and second memory cell arrays 101 and 103 are activated and potentials of the sense amplifier nodes SAN1 and SAN2 are amplified to "H" level and "L" level respectively.

Between the timing t4 and a timing t5, a potential of the bit line BL2 becomes "L" level. Since the transfer gate control signal TG1 is a power source voltage Vcc and the transfer gate transistor 121 having a threshold voltage Vtn is in the cut off state, a potential of the bit line BL1 becomes a level of Vcc−Vtn.

At the timing t5, the transfer gate control signal TG1 becomes over a level of Vcc+Vtn, the voltage of the bit lines BL1 is raised from a level of Vcc−Vtn to "H" level (a level of Vcc). Then, the amplification of the pair of bit lines BP is completed and the reading operation of the memory cell is finished.

At a timing t6, the signal on the selected word line WL becomes "L" level. While the memory cell 109 has "H" level, the transistor 111 is in the off state, that is, the memory cell 109 is disconnected from the bit line BL1. This operation means the finish of the rewriting operation of the memory cell.

At a timing t7, the equalizing control signal EQ1 becomes "H" level and the potentials of the pair of bit lines BL1, BL2 and of the sense amplifier nodes SAN1, SAN2 becomes a reference potential Vcp which is a intermediate potential of Vcc and the ground level. That is the pair of bit lines and the pair of sense amplifier nodes are equalized. At the same time, the transfer gate control signals SLN1 and SLP1 become Vcp.

At a timing t8, the transfer gate control signals TG1, TG2 become "H" level, the transfer gate transistors 121, 123 connected to the second memory cell array 103 are in the on state. Therefore, the nonselected memory cell array is connected to the sense amplifier nodes SAN1, SAN2.

The above mentioned operation is one cycle of the first memory cell array 101.

A pair of bit lines BP in the nonselected memory cell array (the second memory cell array 103) is disconnected from the sense amplifier nodes SAN1 and SAN2 at the timing T1. However, since an equalizing control signal EQ2 is "H" level during the nonselection of the second memory cell array 103, an equalizing transistors 115 connected to the second memory cell array 103 are in the on state. Therefore, the voltage of the pair of bit lines in the nonselected memory cell keep Vcp. At the timing t7, the pair of bit lines in the nonselected memory cell is connected to the sense amplifier nodes SAN1 and SAN2.

In the third and fourth memory cell arrays 105, 107, the operations of control signals TG1, TG2, EQ1 and EQ2 are the same as those mentioned above. However, since sense amplifier control signal SLN2 and SLP2 keep the reference voltage Vcp, pairs of the bit lines in the third and fourth memory cell arrays 105, 107 keep the reference voltage Vcp.

Figure 3:
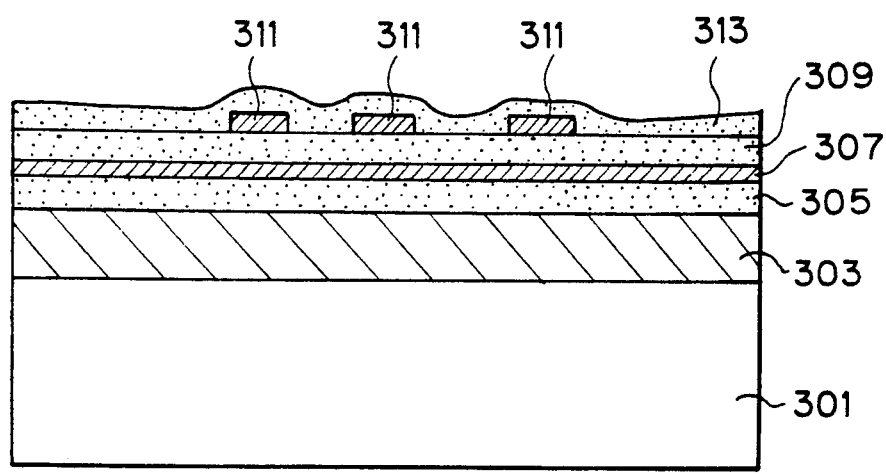
FIG. 3 is a sectional view showing the structure of the semiconductor memory device according to the embodiment of the invention.

The structure of the embodiment will be described with reference to a sectional view. FIG. 3 illustrates a sectional view of the embodiment at a portion where the line TG1 overlaps with the lines RA0 to RAi.

The semiconductor memory device of the embodiment has two aluminum layers in order to realize a high speed operation and to decrease a number of control circuits. Transistors of the semiconductor device are made on a semiconductor substrate 301. However, there is no transistor in FIG. 3 because FIG. 3 illustrates a sectional view of an area having no transistors.

A field oxide layer 303 is formed on the semiconductor substrate 301. The field oxide layer isolates active regions (not shown) where the transistors is formed. A first insulating layer 305 is formed on the field oxide layer 303. A first aluminum layer 307 is formed on the first insulating layer 305. The word lines WL and the lines EQ1, EQ2, TG1 and TG2 are formed by the first aluminum layer 307. These lines extend in a parallel direction with each other.

A second insulating layer 309 is formed on the first aluminum layer 307. A second aluminum layer 311 is formed on the second insulating layer 309. The lines RA0 to RAi which extend substantially perpendicular direction to the word line are formed by the second aluminum layer 311. A protective layer 313 is formed on the entire surface of the device.

As has been described, according to the invention, the semiconductor memory device of the embodiment has only one transfer gate control circuit and one equalizing circuit, so the semiconductor memory has a small number of circuits and more integrated memory can be obtained. Moreover, according to the invention, the semiconductor memory device has two aluminum wiring layers, so the high speed operation can be achieved.

It will be understood that the above description of the present invention is susceptible to various modifications, changes and adaptations, and the same are intended to be comprehended within the meaning and rage of equivalents of the appended claims. For example, while in the embodiment the aluminum layer is described, other metal layer can replace the aluminum layer as a low resistance conductive layer.

What is claimed is:

1. A semiconductor memory device having a plurality of bit lines, and a plurality of memory cells connected to the bit lines, the semiconductor memory device comprising:

a plurality of control circuits outputting a plurality of control signals;

a first control line formed by a first low resistance conductive layer, the first low resistance conductive layer being formed on a substrate forming the plurality of control circuits, the first control line connected to a first control circuit of the plurality of control circuits to transfer the first control signal and extending in a first direction;

a second control line formed by a second low resistance conductive layer, the second low resistance conductor layer being formed on the substrate and being separated from the first conductive layer by an insulating layer, the second control line connected to a second control circuit of the plurality of control circuits to transfer the second control signal and extending in a second direction which is substantially different from the first direction.

2. A semiconductor memory device according to claim 1, wherein the first and second control signals are formed on layers overlapped with each other.

3. A semiconductor memory device according to claim 1, wherein said plurality of control circuits include a row decoder, a transfer gate control circuit and an equalizing control circuit.

4. A semiconductor memory device according to claim 1, wherein the first low resistance conductive layer is an aluminum layer.

5. A semiconductor memory device according to claim 1, wherein the second low resistance conductive layer is an aluminum layer.

6. A semiconductor memory device according to claim 1, wherein the first direction is substantially perpendicular to the second direction.

7. A semiconductor memory device comprising:
a plurality of memory cell arrays, each having
    a plurality of memory cells, each memory cell having a cell transistor and a capacitor;
    a plurality of pairs of bit lines, each of the pairs having a first and a second bit line, each bit line having a first end and a second end, the memory cell connected to the first bit line, and
    a plurality of word lines connected to gates of the cell transistors;
a plurality of sense amplifiers each of which have a first sense amplifier node and a second sense amplifier node and a control terminal;
a transfer gate control circuit having a first control line;
a plurality of transfer gate transistors each of which is connected between the first end of a bit line and the first sense amplifier node to control the connection thereof, a gate of the transfer transistor connected to the first control line;
an equalizing control circuit having a second control line;
a plurality of equalizing transistors each of which is connected between the second end of each bit line of each pair of bit lines to control the connection thereof, a gate of the equalizing transistor connected to the second control line; and
a row decoder having an input line for receiving a row address buffer output signal, the row decoder connected the plurality of word lines;
wherein the first and second control lines each are formed by a first low resistance conductive layer, the first low resistance conductive layer is formed on a substrate having the plurality of memory cells and the input line is formed by a second low resistance conductive layer formed on the substrate and separated from the first conductive layer by an insulating layer.

8. A semiconductor memory device according to claim 7, wherein the semiconductor device further comprises a plurality of sense amplifier control lines and the control terminals of the sense amplifiers connected to the bit lines in the same memory cell array are connected to the same sense amplifier control line.

9. A semiconductor memory device according to claim 7, wherein each sense amplifier of the plurality of sense amplifiers has a first transistor including a source connected to the first node, a gate connected to the second node and a drain connected to the control terminal, and a second transistor including a source connected to the second node, a gate connected to the first node, and a drain connected to the control terminal.

10. A semiconductor memory device according to claim 7, wherein the first low resistance conductive layer is an aluminum layer.

11. A semiconductor memory device according to claim 7, wherein the second low resistance conductive layer is an aluminum layer.

12. A semiconductor memory device according to claim 7, wherein the first and second control lines extend in a first direction, and the input line extends in a second direction which is substantially different from the first direction.

13. A semiconductor memory device according to claim 12, wherein the first and second conductive layers are overlapped with each other.

14. A semiconductor memory device according to claim 12, wherein the first direction is substantially perpendicular to the second direction.

* * * * *